(12) United States Patent
Sarabandi et al.

(10) Patent No.: US 10,333,457 B2
(45) Date of Patent: Jun. 25, 2019

(54) BOWTIE NANOANTENNAS FOR EFFICIENT THERMOPHOTOVOLTAICS AND ENHANCED SENSITIVITY IR PHOTODETECTORS

(71) Applicant: The Regents of The University of Michigan, Ann Arbor, MI (US)

(72) Inventors: Kamal Sarabandi, Ann Arbor, MI (US); Sangjo Choi, San Diego, CA (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 689 days.

(21) Appl. No.: 14/741,662

(22) Filed: Jun. 17, 2015

(65) Prior Publication Data

US 2015/0365043 A1 Dec. 17, 2015

Related U.S. Application Data

(60) Provisional application No. 62/013,248, filed on Jun. 17, 2014.

(51) Int. Cl.
*H02S 10/30* (2014.01)
*G01J 5/08* (2006.01)
(Continued)

(52) U.S. Cl.
CPC ............ *H02S 10/30* (2014.12); *G01J 5/0837* (2013.01); *G01J 5/20* (2013.01);
(Continued)

(58) Field of Classification Search
CPC .......... H02S 10/30; H01L 27/14; H01L 29/08
See application file for complete search history.

(56) References Cited

U.S. PATENT DOCUMENTS 8,053,734 B2 11/2011 Kirby et al.
2002/0175273 A1* 11/2002 Moddel .................. B82Y 10/00
250/214 R
(Continued)

FOREIGN PATENT DOCUMENTS

EP 2318878 A2 5/2011

OTHER PUBLICATIONS

K. Sarabandi, et al. "Design optimization of bowtie nanoantenna for high-efficiency thermophotovoltaics", Journal of Aoolied Physics, Aug. 2013.*
(Continued)

*Primary Examiner* — Karen Kusumakar
(74) *Attorney, Agent, or Firm* — Harness, Dickey & Pierce, P.L.C.

(57) ABSTRACT

A matching technique and the field enhancement at the terminals of a bowtie nanoantenna is presented to develop compact, highly efficient, and flexible thermophotovoltaic (TPV) cells. The bowtie antenna is designed for maximum power transfer to a near infrared band of a TPV cell. In one example, a small cube of indium gallium arsenide antimode or another suitable material with a low bandgap energy of 0.52 eV is mounted at the terminals of the antenna. Such a load presents a frequency dependent impedance with a high resistance and capacitance at the desired frequency (180THz). For maximum power transfer, a high impedance bowtie antenna operating at the anti-resonance mode connected to an inductive transmission line to compensate for the load capacitance is realized. The same antenna and load configuration with the semiconductor material used in photoconductive mode is used to realize a sensitive uncooled photodetector.

17 Claims, 10 Drawing Sheets

(51) Int. Cl.
    *H01L 31/0304*     (2006.01)
    *H01L 31/0693*     (2012.01)
    *G01J 5/20*     (2006.01)

(52) U.S. Cl.
    CPC .... *H01L 31/03046* (2013.01); *H01L 31/0693* (2013.01); *Y02E 10/544* (2013.01)

(56) References Cited

U.S. PATENT DOCUMENTS

| | | | | |
|---|---|---|---|---|
| 2005/0093023 | A1* | 5/2005 | Raspopin | B82Y 20/00 |
| | | | | 257/202 |
| 2006/0273301 | A1* | 12/2006 | Moddel | B82Y 10/00 |
| | | | | 257/30 |
| 2014/0158198 | A1* | 6/2014 | Simovski | B82Y 20/00 |
| | | | | 136/259 |
| 2014/0366927 | A1* | 12/2014 | Lavrova | H02J 17/00 |
| | | | | 136/244 |

OTHER PUBLICATIONS

K. Sarabandi, et al, "Design optimization of bowtie nanoantenna for high-efficiency thermophotovoltaics", Journal of Applied Physics, Aug. 2013.

\* cited by examiner

A bulk InGaAsSb block
(Active area $A_d = A_o$)

A tiny InGaAsSb block
(Active area $A_d \ll A_o$)

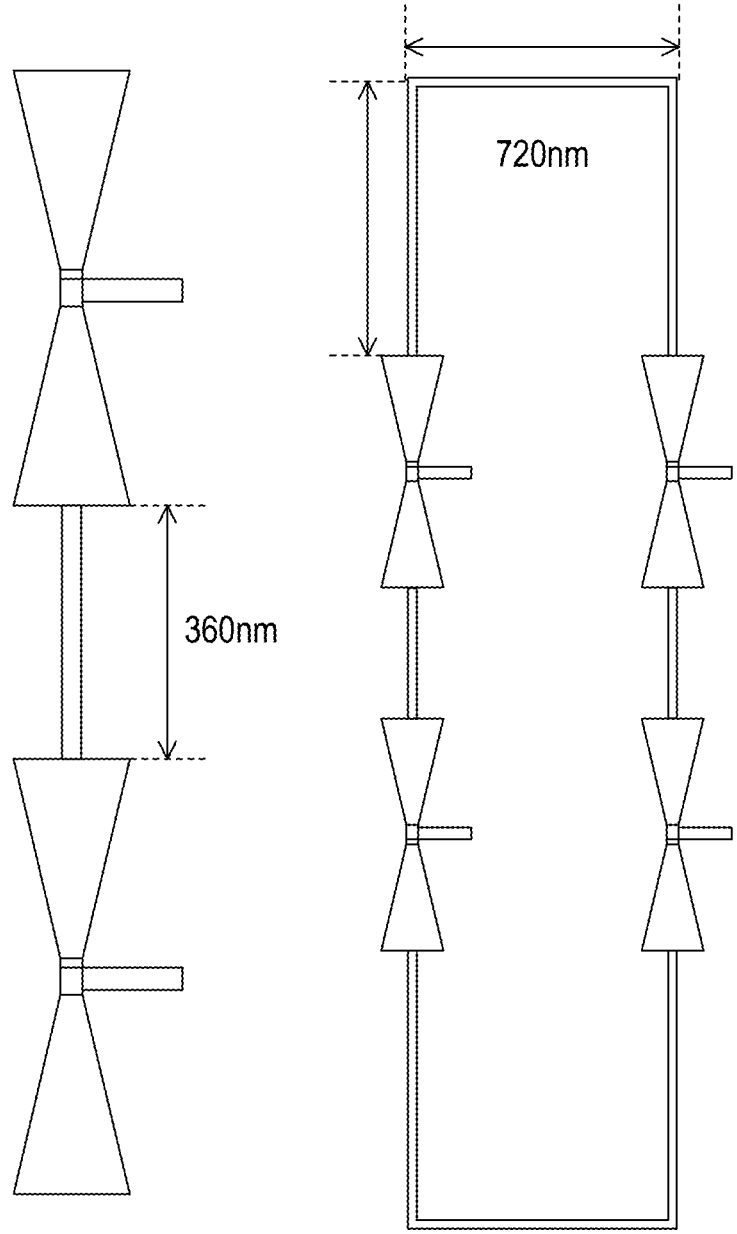
FIG. 13A   FIG. 13B

BOWTIE NANOANTENNAS FOR EFFICIENT THERMOPHOTOVOLTAICS AND ENHANCED SENSITIVITY IR PHOTODETECTORS

CROSS-REFERENCE TO RELATED APPLICATIONS

This application claims the benefit of U.S. Provisional Application No. 62/013,248 filed on Jun. 17, 2014. The entire disclosure of the above application is incorporated herein by reference.

FIELD

The present disclosure relates to the application of bowtie nanoantennas for enhanced energy conversion photovoltaic devices and IR detectors.

BACKGROUND

Thermophotovoltaics (TPV) are p-n junction semiconductor devices, which convert thermal energy to electricity. Such devices are being envisioned as efficient converters of chemical to electrical energy, which are scalable to very small sizes. Compared to conventional photovoltaic system, TPV needs an emitter, which is heated by combustion of hydrogen sources and flammable gases. Radiated energy from a heated emitter operating at a lower temperature of approximately 2000° C. falls into the near infra-red (NIR) spectrum. In contrast to Photovoltaics (PV) systems (T~6000° C.) that operate at the visible band, TPV cells require semiconductors with much lower band-gap. The antimonide-based cells such as Indium Gallium Arsenide Antimonide (InGaAsSb) or Gallium Arsenide (GaAs) are shown to have low band-gap values ($E_g$=0.35~0.7 eV) suitable for TPV Cells. Current high-efficiency TPV cells must utilize a thick layer of a low bandgap semiconductor, as such materials at near-infrared have very low absorption coefficient. Also a photonic crystal-based emitter and filter structure mounted on a low bandgap semiconductor have been introduced to enhance the overall efficiency of TPV systems. A mm-size TPV system, where the photonic crystal emitter, InGaAsSb cells, and a maximum power point tracker are all integrated into a single device, has recently been fabricated and shown to present a power conversion efficiency of ~2.2% and output power of 220 mW.

In this disclosure, the use of a low bandgap semiconductor materials, such as InGaAsSb with a bandgap of $E_g$=0.52 eV, in conjunction with a resonant nanoantenna is proposed in order to improve the performance of TPV cells. Instead of a bulk semiconductor that is commonly used for infrared energy conversion, a resonant nanoantenna loaded with a nano-meter size low bandgap semiconductor load has the potential to reduce a TPV system's volume and improve its efficiency due to the field enhancement at the antenna terminals. However, such low bandgap material at infrared frequencies possesses low conductivity and high permittivity with significant frequency dispersion. As a result, such a load cannot easily be matched to dipole antennas similar to those already considered in the literature. For a given low bandgap TPV semiconductor material and frequency band, a design procedure for a high impedance bowtie nanoantenna is presented. The combination of a frequency dependent load and the nanoantenna structure is simultaneously optimized to achieve the best thermal conversion to electricity. Here, a bowtie antenna topology is considered for achieving a higher intrinsic bandwidth and for the fact that such topology allows for simple connection of such TPV cells in series or parallel configurations. Thin nano-wires of resonant length can connect the ends of adjacent bowties for collecting DC current without affecting the infrared performance of individual nanoantennas. The antenna is operated at its anti-resonance mode (also referred to as parallel mode), instead of the series resonance mode normally used in RF antennas, to allow for load impedance matching at high levels. An extra transmission line stub placed in parallel with the semiconductor load can be utilized to compensate for the high capacitance of the load. It is emphasized here that the antenna impedance at the parallel resonance is purely resistive. Considering the InGaAsSb load and the parallel stub attached to it, then the maximum power transfer condition is met if the input admittance of the antenna is equal to that of the antenna load. The nanoantenna's dimensions including its length, angle, the size of the embedded load, and the parallel strip stub parameters are designed for the maximum power transfer.

This section provides background information related to the present disclosure which is not necessarily prior art.

SUMMARY

This section provides a general summary of the disclosure, and is not a comprehensive disclosure of its full scope or all of its features.

An enhanced energy conversion device is presented. The energy conversion device is comprised of a conversion cell and a nanoantenna. The conversion cell is comprised of a body defining one or more surfaces for receiving infrared radiation and includes at least two semiconductors forming a p-n junction. The nanoantenna is configured to receive infrared radiation at a desired frequency and, in response to the infrared radiation at the desired frequency, operates at a parallel resonance. During operation, the nanoantenna encapsulates a portion of the conversion cell and transfers received infrared radiation thereto. The conversion cell is preferably impedance matched to the nanoantenna for maximum power transfer.

In an example embodiment, the nanoantenna is in shape of a bowtie and has two terminals, such that the conversion cell is arranged at middle of the nanoantenna and between the two terminals of the nanoantenna. The length of the bowtie can be set at a value so that the parallel resonance of the nanoantenna occurs at the desired frequency. The fan angle of the bowtie can be set to a value so that input impedance of the nanoantenna matches the load resistance at the desired frequency.

In the example embodiment, the conversion cell is further defined as a cube having a thickness sized to match the radiation resistance of the nanoantenna. The conversion cell is also comprised of materials having a bandgap energy level on the order of 130 Terahertz.

In some embodiments, a shunt inductor is electrically coupled to terminals of the nanoantenna to compensate for the capacitive susceptance of the conversion cell in middle of the nanoantenna. The shunt inductor may be implemented by an open-ended transmission line extending outwardly from each terminal of the nanoantenna, where the transmission lines are oriented transverse to length of the nanoantenna and parallel to each other.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 13A and 13B are a diagram depicting an example bowtie array configuration.

Corresponding reference numerals indicate corresponding parts throughout the several views of the drawings.

DETAILED DESCRIPTION

Example embodiments will now be described more fully with reference to the accompanying drawings.

Lenses and reflectors are commonly used to increase the sensitivity of photodetectors or as concentrators for PV cells. These concentrators are bulky and cumbersome for integration with such devices. In addition, the spot size at the focal plane is diffraction limited. Considering the fact that resonant antennas present effective apertures that are commonly much larger than their physical aperture and that their ports at which the signal concentrates can be made much smaller than a wavelength, resonant antennas can be used to concentrate the IR energy into a very small area.

By way of example, indium gallium arsenide antimonide (InGaAsSb) is shown to provide a low bandgap energy level of 0.52 eV, which is suitable for photovoltaic and photoconducting applications in the near-infrared region. This band-gap energy level corresponds to energy of a photon at 130 THz. Hence such a material has a cut-off wavelength of 2.4 µm, i.e., the bulk material conductivity is expected to be very low at frequencies below 130 THz. The center of the band at which the material (InGaAsSb) assumes its maximum quantum efficiency occurs at approximately 1.67 µm, which corresponds to 180 THz. This center frequency will be used as the optimal resonant frequency for the nanoantenna. While specific reference is made throughout this disclosure to InGaAsSb, it is readily understood that other suitable materials may be used, especially those having a bandgap energy level on the order of 130 Terahertz or lower.

Figure 1:
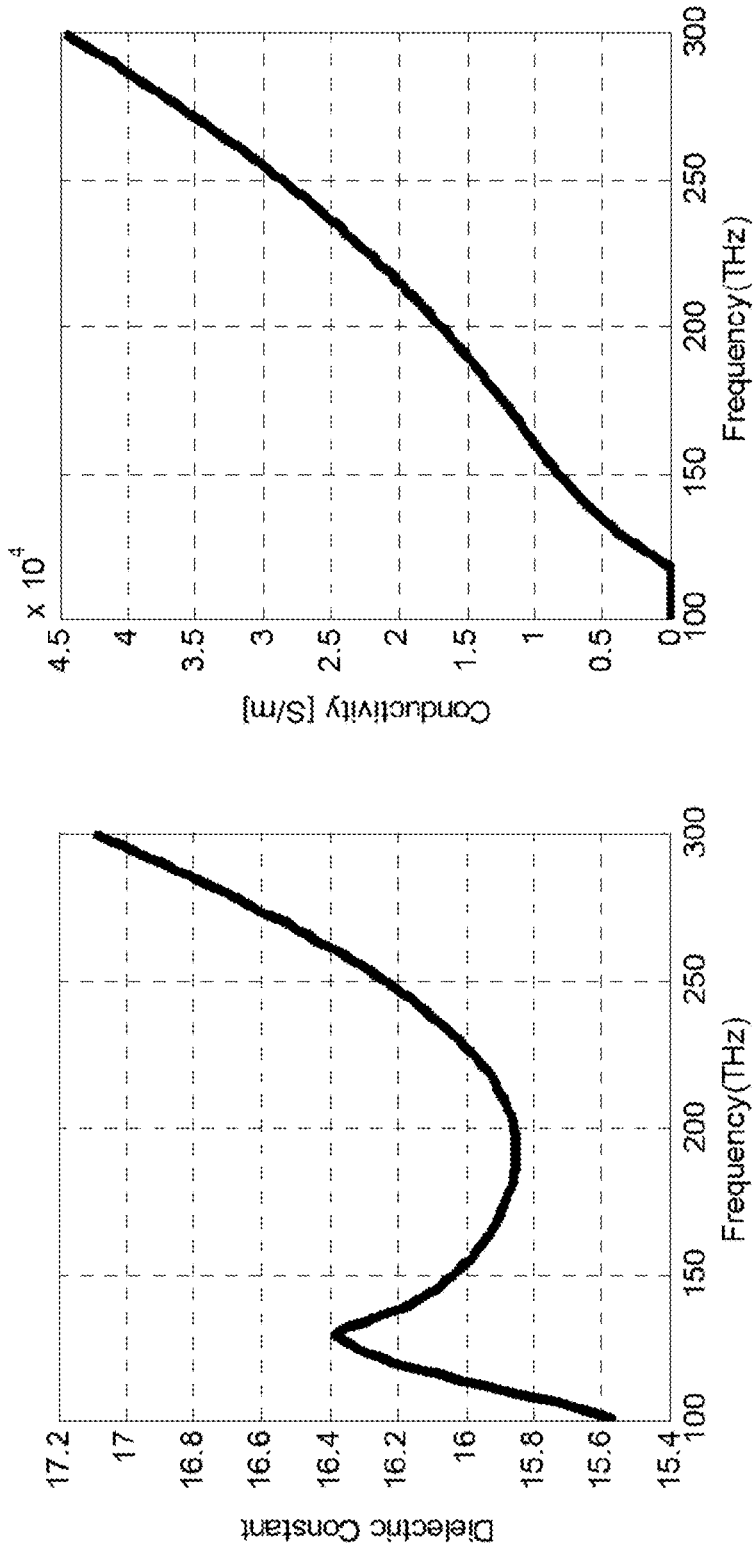
FIG. 1 shows graphs illustrating dielectric constant and conductivity, respectively of InGaAsSb.

To calculate the equivalent impedance of InGaAsSb with a specific dimension as the antenna load, the constitutive parameters of InGaAsSb as a function of frequency are needed. The relative permittivity and conductivity of InGaAsSb from 100 THz to 300 THz is shown in FIG. 1. As shown the real part of the relative dielectric constant is approximately 16 and its variation with frequency (beyond the cut-off frequency) is rather gentle. However, the material conductivity (extracted from the imaginary part of the complex dielectric constant), which is proportional to absorption, is a strong function of frequency and assumes high values only after the cut-off frequency near 126 THz. At the desired frequency of 180 THz, the conductivity of InGaAsSb is ~$1.5 \times 10^4$ [S/m] and the corresponding skin depth is 419 nm.

Figure 2:
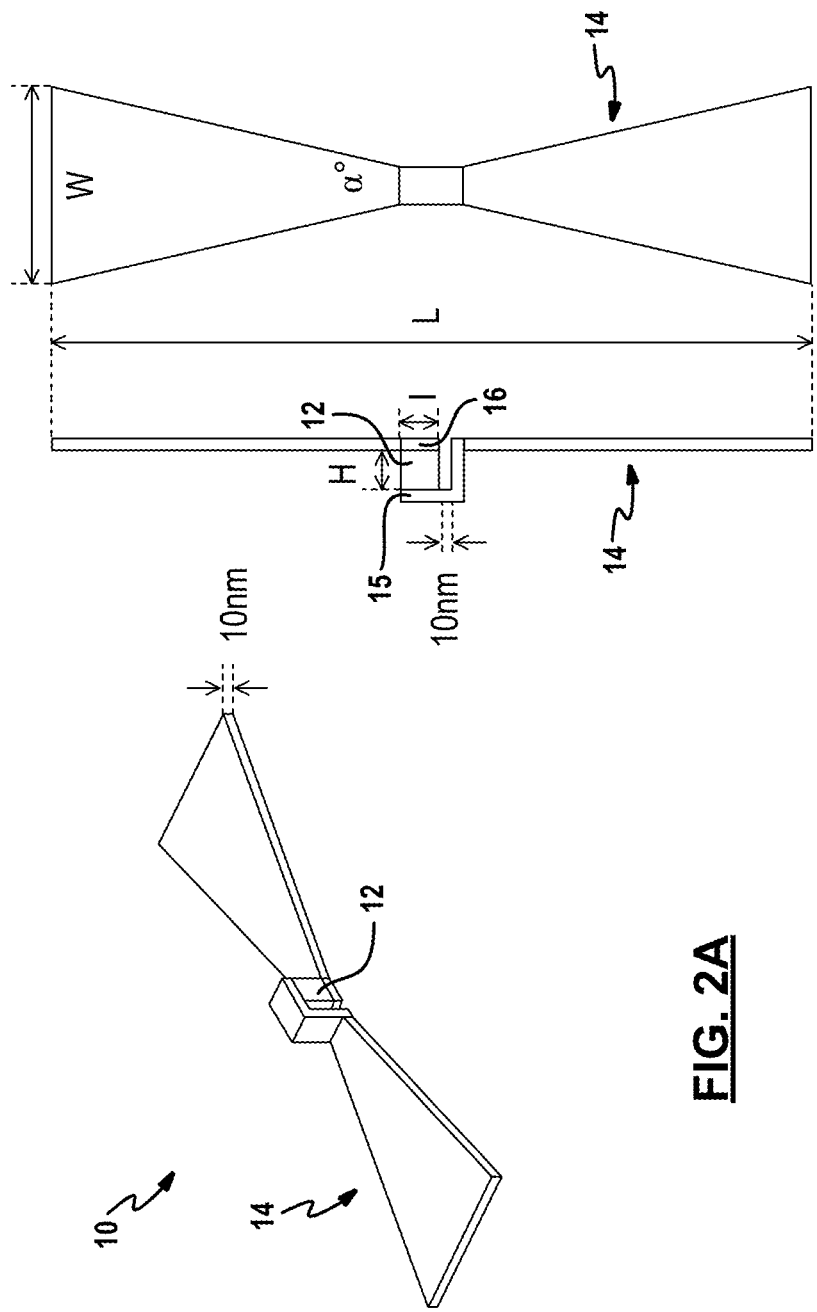
FIG. 2A is a perspective view of a proposed energy conversion device.
FIG. 2B is a side view of the proposed energy conversion device.
FIG. 2C is a top view of the proposed energy conversion device.

FIGS. 2A-2C illustrate a proposed energy conversion device 10. The energy conversion device 10 is comprised generally of a conversion cell 12 and a nanoantenna 14. The nanoantenna 14 is configured to receive infrared radiation and operate at a parallel resonance as further described below. The nanoantenna 14 concentrates the infrared radiation towards middle of the structure where two electrodes 15, 16 are formed. The conversion cell 12 is placed between the two metal electrodes 15, 16 such that the infrared radiation can be transferred thereto. The conversion cell 12 in turn converts the infrared radiation to an electric current.

In an example embodiment, the nanoantenna 14 is in shape of a bowtie (also referred to herein as a bowtie nanoantenna). The nanoantenna 14 may be comprised of gold or other suitable metals. The conversion cell 12 is a body in the shape of a cube and includes at least two semiconductors forming a p-n junction. In this example, the p-n junction is formed from indium gallium arsenide antimonide. The p-n junction may also be comprised of indium phosphide arsenide antimonide or other suitable materials having a bandgap energy level on the order of 130 Terahertz or lower.

For discussion purposes, the geometric parameters of the energy conversion device 10 are denoted as follows: the length of the bowtie antenna 14 including its terminal is L, the end width of the bowtie antenna 14 is represented by W, the fan angle of the bowtie antenna 14 is α, the thickness of the bowtie antenna 14 is T (e.g., 10 nm), the height of the conversion cell 12 is H, and the length of the conversion cell 12 has a square cross section is l.

The body of the conversion cell 12 is placed between and in directed contact with the two electrodes 15, 16 of the nanoantenna 14. The equivalent circuit of InGaAsSb load can be represented by a conductance ($G_{InGaAsSb}$) and a susceptance ($B_{InGaAsSb}$) connected in parallel. Both parameters can simply be modeled by $$G_{InGaAsSb} = \sigma_{InGaAsSb} \cdot \frac{A}{H} \text{ and } B_{InGaAsSb} = j\omega\varepsilon_0\varepsilon_{InGaAsSb} \cdot A/H,$$

where A is the area of the electrode and H is the separation between the two electrodes. The expected size of the antenna at 180 THz is on the order of hundreds of nanometers; hence the size of the load at the antenna port falls into tens of nano-meters scale. This tiny InGaAsSb load shows high capacitance and resistance despite its relatively high conductivity. Both the center frequency and the equivalent impedance of the InGaAsSb load affect the bowtie nanoantenna design. The bowtie topology is also used to achieve a relatively wideband operation. While reference is made to an antenna having a bowtie, it is understood that the broader aspects of this disclosure pertain more generally to nanoantennas with varying shapes.

Considering the fabrication constraints, the metallic wings of the bowtie antenna are patterned over a thin flat sheet on which a small block of InGaAsSb with appropriate dimensions is grown. The numerical simulations were calculated with a commercial full-wave simulation tool based on the finite element method, Ansoft HFSS. Volumetric tetrahedral with dimensions less than $\lambda/167$ within the metal (down to 0.82 nm) are used to discretize the domain. All metallic traces in the simulations are modeled by the Drude formula for conductors. Using gold, a plasma frequency of 2080 THz and the scattering coefficient of $55\times10^{12}$ [$s^{-1}$] are used in the Drude model.

As mentioned above, the load resistance of a very thin InGaAsSb load is rather high due to the very small lateral dimensions of the load (comparable to the size of the bowtie antenna terminals). These high input impedance values cannot easily be matched to the traditional 73Ω dipole antennas or even smaller resistance of a 22Ω for a plasmonic antenna. Noting that linear antennas can present an anti-resonance behavior at a frequency slightly above the series resonance, the antenna length is chosen to be larger than it would be if it were to operate at its series resonance. For this mode, the input resistance of the antenna is very large (an order of kΩs). To match the input resistance of the antenna to the load resistance at the center frequency (180 THz), the angle of the bowtie antenna, α can be adjusted. In the example embodiment, the fan angle is approximately 30 degrees. However, it is understood that the fan angle can be set to a different value so that input impedance of the nanoantenna matches the load resistance at the desired frequency. This parameter also affects the antenna bandwidth. It is noted here that the higher the antenna input resistance, the smaller the bandwidth. Hence it is desirable to reduce the load resistance as much as possible. Since the material conductivity is fixed, the value of this resistance is determined by the load length and height. The maximum length is limited by the maximum antenna terminal size and the minimum load height is limited by the material growth technique. Herein, the dimension of the load is fixed to 30 nm×30 nm×30 nm (H×l×l), which should be compatible with epitaxial growth fabrication process.

To design the structure, first the antenna 14 should be designed and characterized without considering the effect of the load. The input impedance of the antenna 14 for which air is filled between the terminals (in the absence of the semiconductor) was calculated by using a voltage gap source excited at the terminals. A separate numerical simulation using the same voltage gap excitation also calculated the capacitance of load with air filling (30 nm by 30 nm by 30 nm) at the terminals. It should be noted that this simulation takes into account the fringing effort. Finally, the intrinsic input impedance of the bowtie antenna was calculated by de-embedding the capacitance at the antenna terminals from the input impedance of the bowtie antenna with the load terminal.

Figure 3:
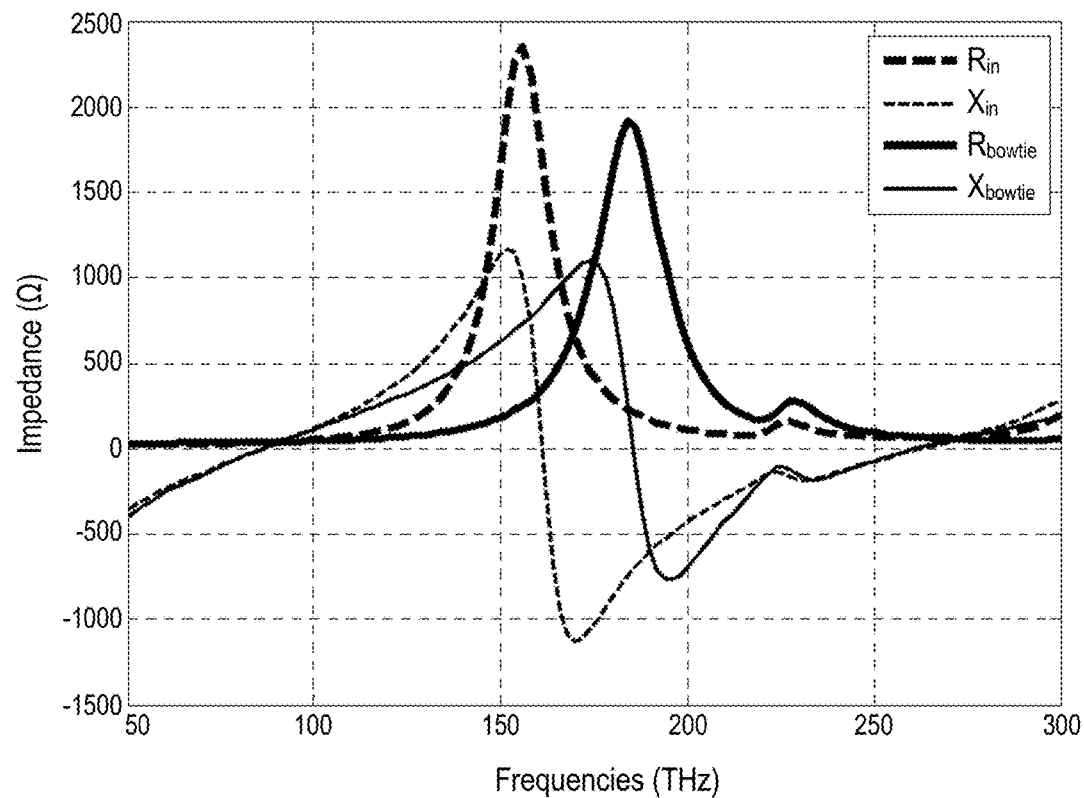
FIG. 3 is a graph illustrating an input impedance of a bowtie nanoantenna without a conversion cell and optimized for a given conversion cell.

Referring to FIG. 3, the parallel resonance (anti-resonance) behavior of the intrinsic input impedance of the bowtie antenna 14 is shown. Here, L is chosen to be 605 nm to achieve a center frequency of 180 THz. Again, the length may vary depending on the application but is set at a value to ensure that the nanoantenna 14 operates at parallel resonance for the desired frequency. In this example, the rest of the dimensions are set as follows: W=160 nm, α=30°, and H=l=30 nm. The solid line shows the intrinsic impedance of the bowtie antenna, where the resistance at the parallel resonance is shown to be around 1.9 kΩ. This input resistance value is optimized by varying α, the bowtie antenna angle, and is determined from the load dimension and material conductivity. It should also be mentioned that the parallel resonance of the bowtie antenna, where gold is modeled by Drude-formula, shows an effective wavelength scaling due to the plasmonic effect of metals at IR bands and above. 605 nm-long Perfect Electric Conductor bowtie antennas would have its computed parallel resonance at ~264 THz, whereas the same antenna made with gold (using the Drude-model) shows its parallel resonance at ~156 THz. This corresponds to a wavelength scaling factor of 1.69 ($\lambda_{eff}=\lambda/1.69$).

Figure 4:
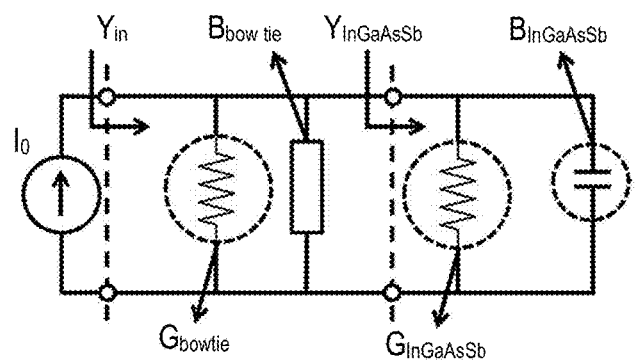
FIG. 4 is a schematic of an equivalent circuit for a bowtie nanoantenna loaded with InGaAsSb load in receiving mode.

For the maximum power transfer, $G_{bowtie}$ is set equal to $G_{InGaAsSb}$, which is obtained from: $R_{bowtie}=H/(\sigma_{InGaAsSb}\cdot A)$. This value is 1.9 kΩ at 180 Thz, using $\sigma_{InGaAsSb}=1.5\cdot10^4$ [S/m], H=30 nm, and l=~30 nm. Though the high resistance of InGaAsSb load can be matched by the high input resistance of the parallel resonance mode of the bowtie nanoantenna, the capacitance of the InGaAsSb block has not been taken into consideration yet. The effect of the load capacitance can easily be studied using the equivalent circuit model of the bowtie antenna together with the InGaAsSb load (30 nm×30 nm×30 nm) as shown in FIG. 4.

Figure 5:
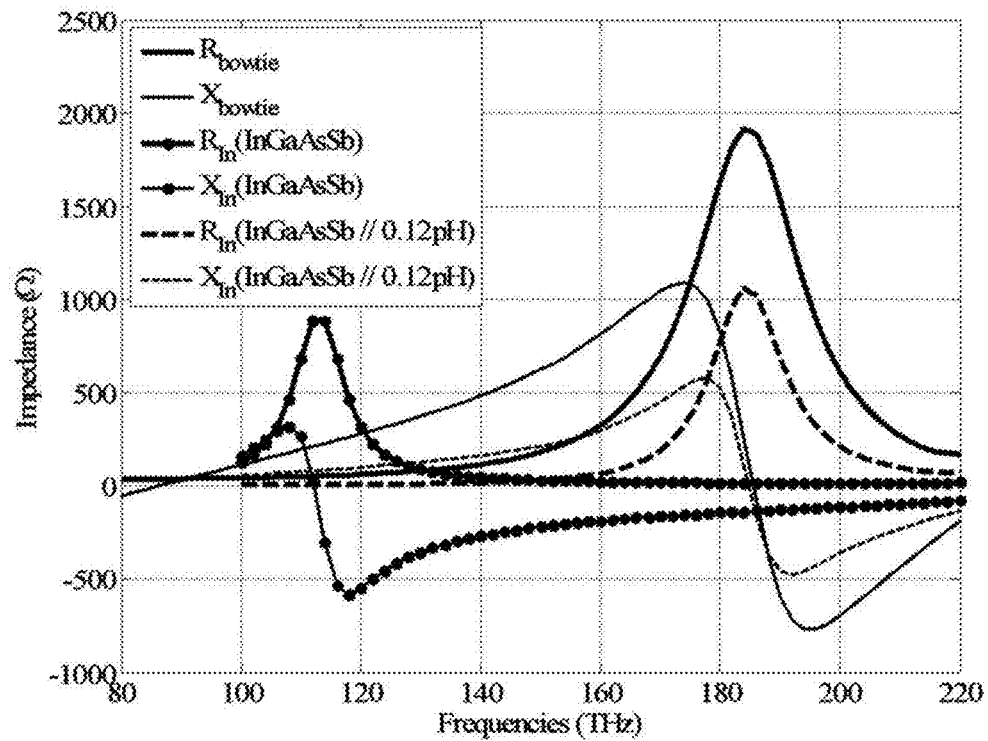
FIG. 5 is a graph illustrating intrinsic input impedance of a bowtie antenna, the input impedance of bowtie antenna loaded with a InGaAsSb load, and the input impedance of a bowtie antenna loaded with a InGaAsSb load shunt with 0.12 pH of an ideal inductor.

The load capacitance that appears in parallel with the parallel LC equivalent circuit of the antenna reduces the resonant frequency. This effect is shown in FIG. 5 (by the solid line with dots), where the input impedance of the bowtie antenna loaded in InGaAsSb load is plotted. The peak at resonance is shifted down to 120 THz. At this frequency, the load resistance is significantly higher than the designed value of 1.9 kΩ due to its low conductivity. Also the antenna 14 at the new resonant frequency shows significantly lower input resistance. These perturb the impedance matching and the maximum power transfer condition. To shift the parallel resonance back to 180 THz, the length of the bowtie antenna 14 can be shortened to resonate at a much higher frequency than 180 THz so that the combined inductive reactance of the antenna 14 can cancel out the capacitive reactance of the load at the desired frequency. However, as shown in FIG. 5, the input resistance at the lower resonance is significantly lower than that at the intrinsic resonance of the antenna. For maximum power transfer at the lower resonance, a smaller load resistance (larger area or lower thickness) will be required. It should be noted that at lower frequencies, the material conductivity is significantly reduced, and therefore the required load area does not scale with frequency. In addition, the larger load area will also increase the capacitance, which in turn further reduces the resonant frequency. Thus, matching at 180 THz, by simply varying the load dimensions, is not feasible. Hence the antenna size scaling approach cannot satisfy the maximum power transfer condition for the parallel resonance mode at 180 THz.

An alternative approach is proposed by introducing a reactive load as an additional parameter to facilitate the maximum power transfer for a load with prescribed dimensions. Basically, a shunt inductance to compensate for the capacitance of InGaAsSb load at 180 THz is introduced as seen, for example in FIG. 6. To determine the value of the shunt inductive reactance, the accurate capacitance value of the load must be determined. Fringing effects of the InGaAsSb load (30 nm×30 nm×30 nm) are taken into account in a full-wave simulation. The simulation showed the reactance of the capacitor to be −j137Ω, which corresponds to a capacitance value of 6.36 fF at 180 THz. A parallel LC circuit has zero susceptance when $$\frac{1}{(2\pi\sqrt{LC})} = f_{res}.$$

This equation gives 0.12 pH for the shunt inductance. In FIG. 5, the input impedance of the bowtie antenna 14 loaded with the InGaAsSb load in parallel with an ideal inductor having an inductance value of 0.12 pH is also shown. As observed, the parallel resonance is shifted back to the desired frequency, 180 THz. Also the combined resistance value shown is almost half of the intrinsic antenna input resistance, which indicates a perfect impedance match and the fulfillment of the maximum power transfer condition.

Figure 6:
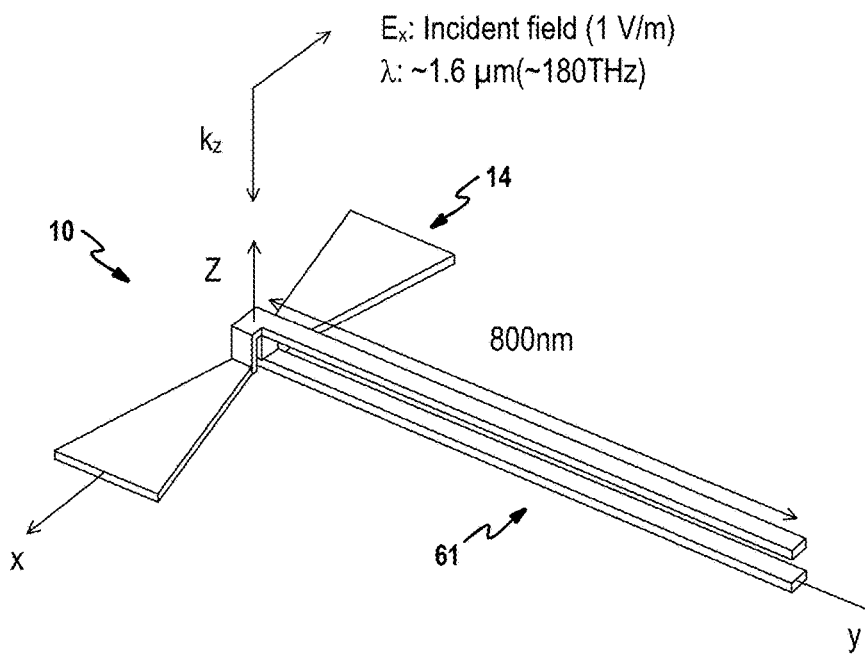
FIG. 6 is a diagram depicting an open-ended transmission line connected in shunt with the load of the antenna.

To implement this inductance for the bowtie nanoantenna structure, an open-ended transmission line stub connected to the InGaAsSb load in shunt is proposed. In one example, an open-ended parallel strip transmission line 61 is connected to the top and bottom of the load electrodes 15, 16 as shown in FIG. 6. An open-ended transmission line, instead of a short-circuited stub, is used to avoid short circuiting the DC voltage of the InGaAsSb p-n junction for TPV or IR detector applications. To estimate the length of the open-ended transmission line, which realizes the required inductance, the effective wavelength at the center frequency should be determined.

Figure 7:
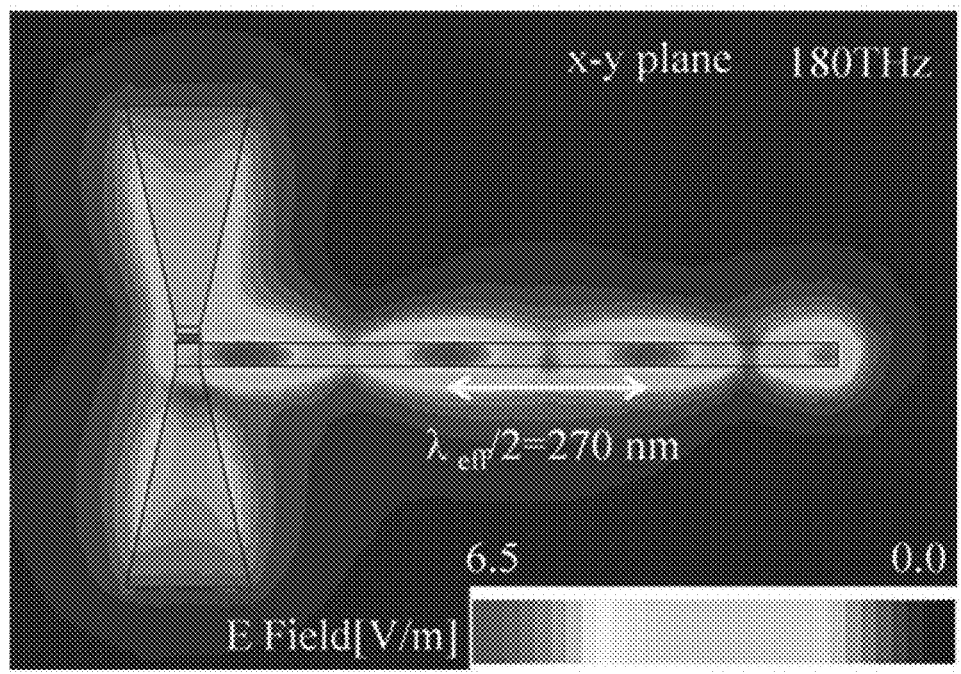
FIG. 7 is an image illustrating magnitude of complex E field on a plane between two strips of the transmission line for a plane wave.

This is done by simulating the standing-wave pattern on a long open stub connected to the bowtie antenna that is illuminated by a co-polarized plane wave. In this case, only the standing wave pattern on the line was used to find the propagation constant or the effective wavelength of the line. The simulation shown in FIG. 7 uses an 800 nm-long open-ended transmission line. As shown in this figure, the peak to peak separation is about 270 nm, indicating the effective wavelength of 540 nm at 180 THz. To obtain an inductive reactance from using the plasmonic open-ended stub, usually its length, depending on the fringing capacitance at the end, should be larger than one quarter of the effective wavelength of the transmission line. It should also be emphasized that the inductance of the transmission line stub (connected to the InGaAsSb load at the antenna terminal) includes its end effect.

Figure 8:
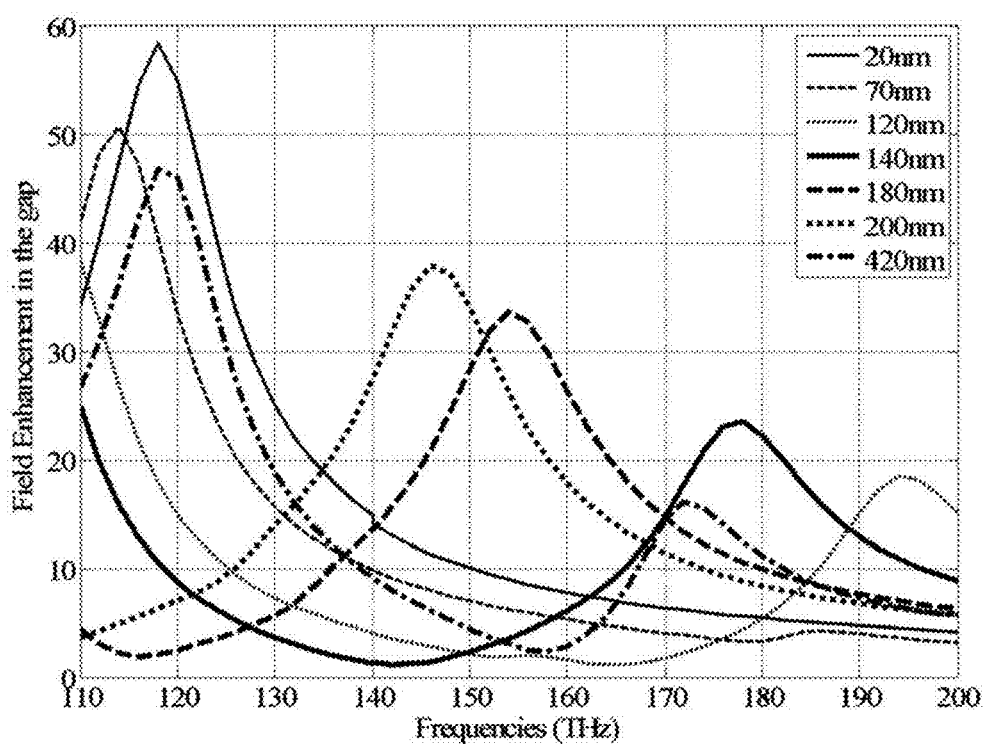
FIG. 8 is a graph illustrating field enhancement at the center of a load versus the stub length as a function of frequency.

For an incident plane wave with field intensity of 1 V/m, the electric field intensity at the antenna terminals is plotted in FIG. 8. The field enhancement, the ratio between the electric field intensity at the antenna terminals and the incident electric field intensity is plotted versus the stub length as a function of frequency. A very short open stub with 20 nm shows a voltage peak near 120 THz, which is expected as the uncompensated load capacitance lowers the resonance to ~120 THz. The load resistance is much higher than that of the antenna, which results in a higher gap voltage, nearly equal to open-circuit voltage. Also, as expected from the analysis of the open-ended transmission line, the bowtie antenna shunt with a 140 nm open stub (longer than one quarter of the effective wavelength of the parallel strip line) shows the peak at near 180 THz. For this stub length, the field enhancement is approximately 23.5, which is almost half the field enhancement value observed for the antenna with the shortest stub. Considering the fact that the voltage at the terminals of a matched antenna is half of the open-circuit voltage, it is apparent that the 140 nm stub is compensating for the load capacitance and that the antenna input resistance is almost equal to that of the load at the desired resonant frequency 180 THz.

To examine the efficiency improvement of the tiny TPV cell at the terminals of the bowtie nanoantenna compared to a bulk TPV cell, the absorption rate is simulated. An infinite slab of bulk InGaAsSb is compared with an infinite array of bowtie nanoantennas loaded with the InGaAsSb load (30 nm×30 nm×30 nm).

Figure 9:
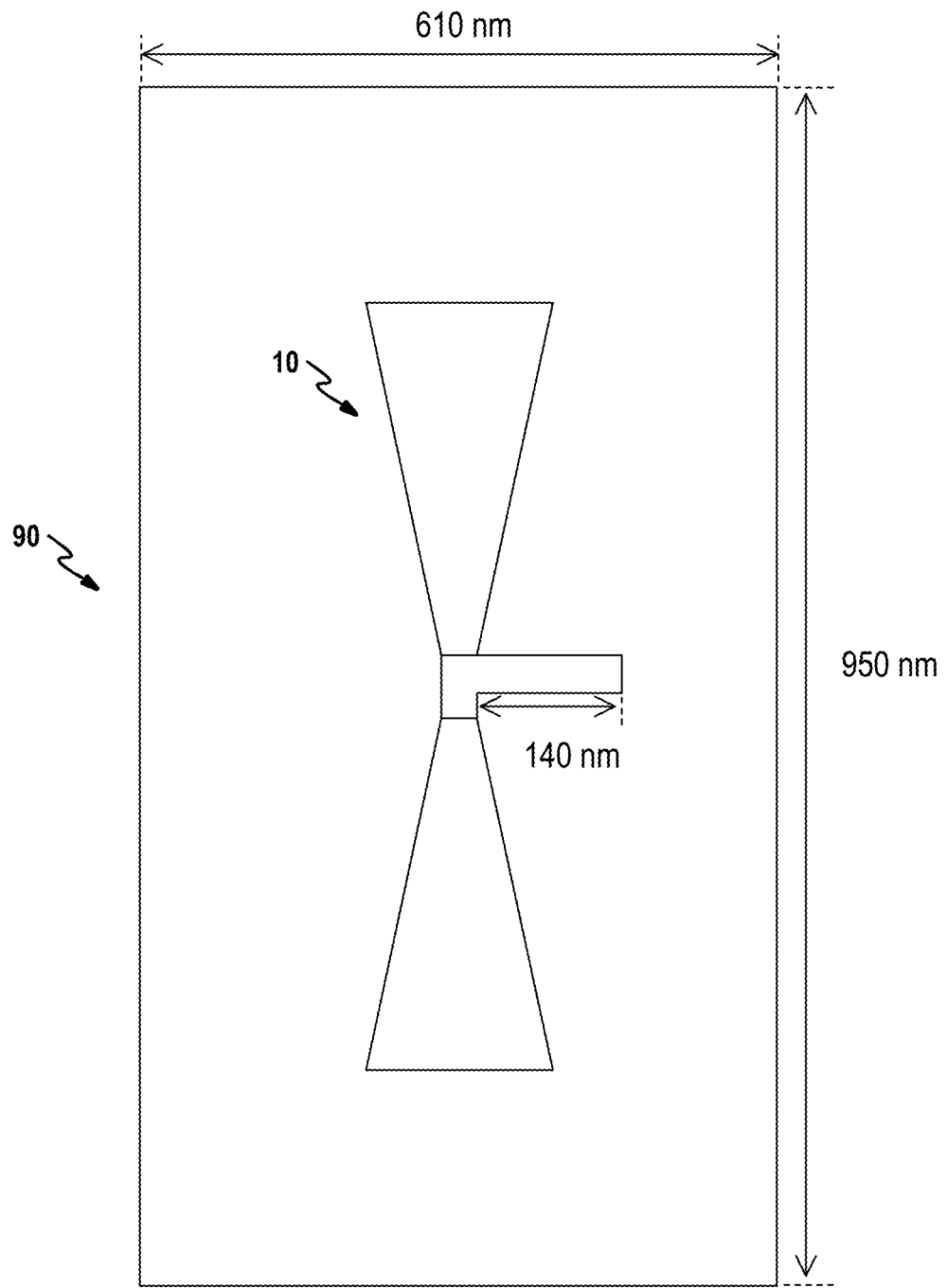
FIG. 9 is a diagram of a unit cell of the bowtie antenna for an infinite array.

Referring to FIG. 9, these simulations are carried out using the periodic boundary condition for a unit cell 90 using a FEM full-wave simulation tool. In this simulation, the area of the unit cell (e.g., 950 nm×610 nm) is set to be slightly larger than the effective area of the bowtie nanoantenna in order to get the same field enhancement as that of a single bowtie nanoantenna. The samples are illuminated by a vertically polarized plane wave at a normal incidence. The field enhancement for the infinite array of the antennas is shown as 23.5, which is identical to the value of a single antenna. In the simulation, the incident power and reflected power at the unit cell are known and the difference is the absorbed power. The percentage of the absorbed power to incident power is calculated for each case and plotted in FIG. 10 as the absorption rate. Note that the DC power generation is directly proportional to the absorbed power by the semiconductor.

Figure 10:
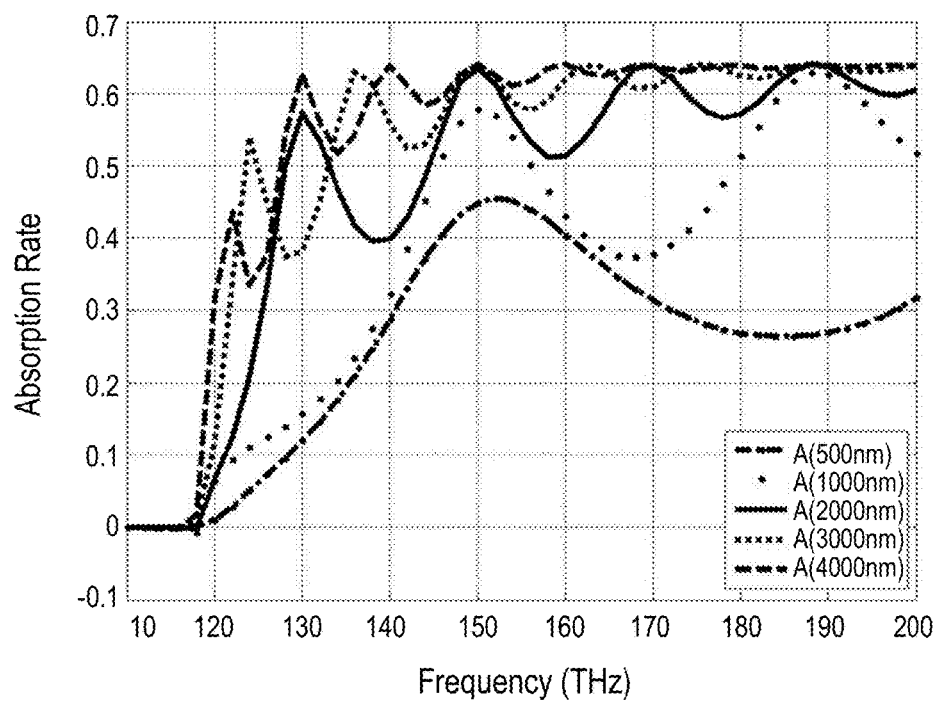
FIG. 10 is a graph depicting an absorption rate of InGaAsSb slab as a function of slab thickness at varying thicknesses.

In FIG. 10, the absorption rate of a 2-3 micron-thick InGaAsSb block is shown to saturate at around 65%. This is mainly due to the impedance mismatch between air and the slab of InGaAsSb. The thickness of the dielectric layer is chosen to be larger than multiple skin depths and hence it practically can be viewed as a semi-infinte lossy dielectric medium.

Figure 11:
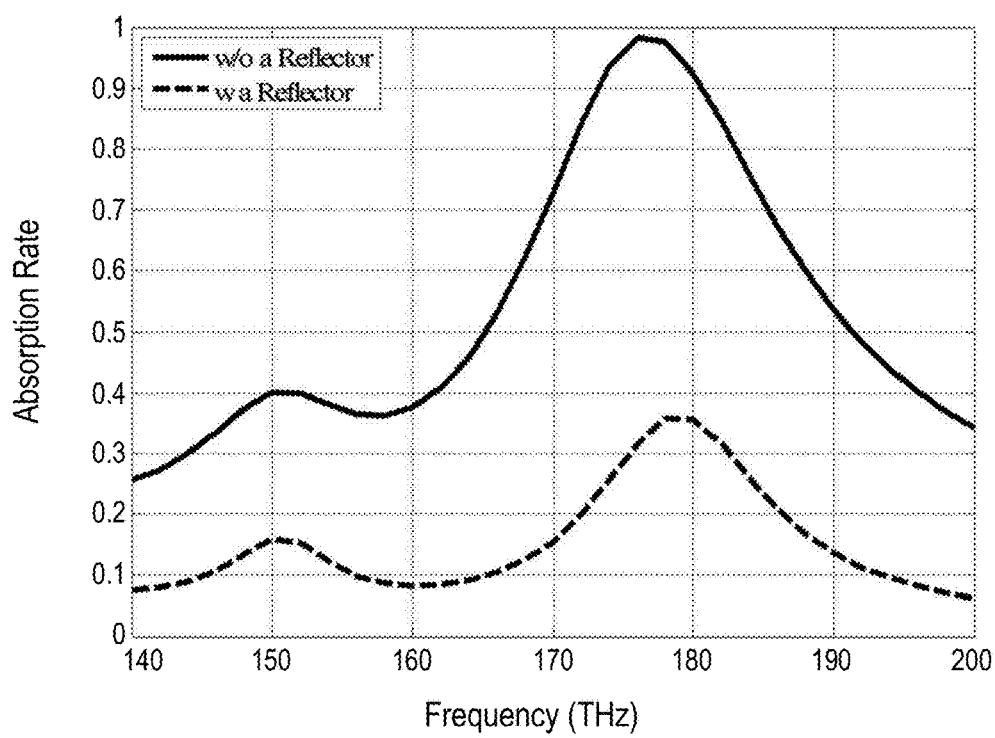
FIG. 11 is a graph depicting absorption rate of bowtie nanoantenna loaded InGaAsSb block with and without a back metallic reflector.

The simulation results for the absorption rate of the infinite array of bowtie nanoantennas are shown in FIG. 11. Here, an absorption rate of only 38% at the resonance is shown. This level is low due to the antennas scatter significant amounts of energy in the forward direction. For a fair comparison with the semi-infinite InGaAsSb layer, the forward-scattered energy must be redirected back to the array. By placing a metallic reflector located at a quarter-wave (or an odd integer multiple of λ/4) behind the array, the forward scattered wave can also be captured by the nanoantenna array. The absorption rate of the array with the metallic reflector behind the array is also shown in FIG. 11, where ~95% absorption efficiency is demonstrated. The higher absorption rate, lower material usage, and flexible implementation show the superiority of the nanoantenna design. One additional advantage of the antenna-mounted TPV cell is that small TPV arrays of finite number of cells can be arranged to obtain a desired voltage or current outputs.

Next, the radiation efficiency of the antenna is presented to examine the ratio of power loss in the metallic traces of the antenna to the power absorbed in the InGaAsSb load. The radiation efficiency of the bowtie antenna is computed as the ratio of total power radiated to the power delivered to the antenna terminal. The radiated power is the difference between the input power and ohmic loss. The ohmic loss is calculated from the electric field and the conductivity inside the gold medium. It is found that the radiation efficiency of the antenna made from 10 nm-thick gold is about 70% at its parallel resonance. It is also interesting to note that the radiation efficiency of the bowtie antenna at its series resonance (the first resonance) is merely about 30%. This is another reason for operating the antenna at its parallel resonant mode. To increase the efficiency of the antenna, the thickness of the gold traces can be increased. Increasing the metal thickness leads to a slightly lower wavelength scaling factor or equivalently longer bowtie for resonance at 180 THz. This also leads to lower input impedance for which the load size must be adjusted. Two additional simulations for metal thickness values of 15 nm and 20 nm are carried out. The antenna with 15 nm metal thicknesses shows an improved radiation efficiency of 75% and efficiency of the antenna with 20 nm metal thickness reaches up to 80% efficiency. Both are at the parallel resonance (~180 THz).

Figure 12A:
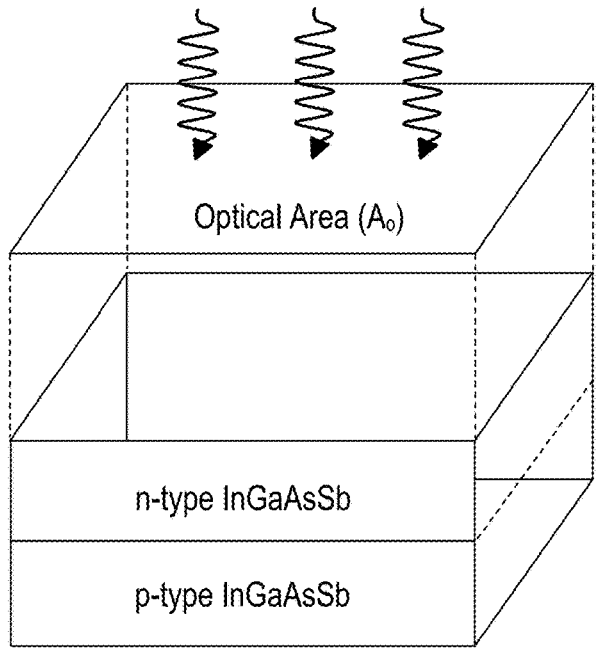
FIGS. 12A and 12B depict a conventional IR detector and an IR detector incorporating a loaded nanoantenna, respectively.
Figure 12B:
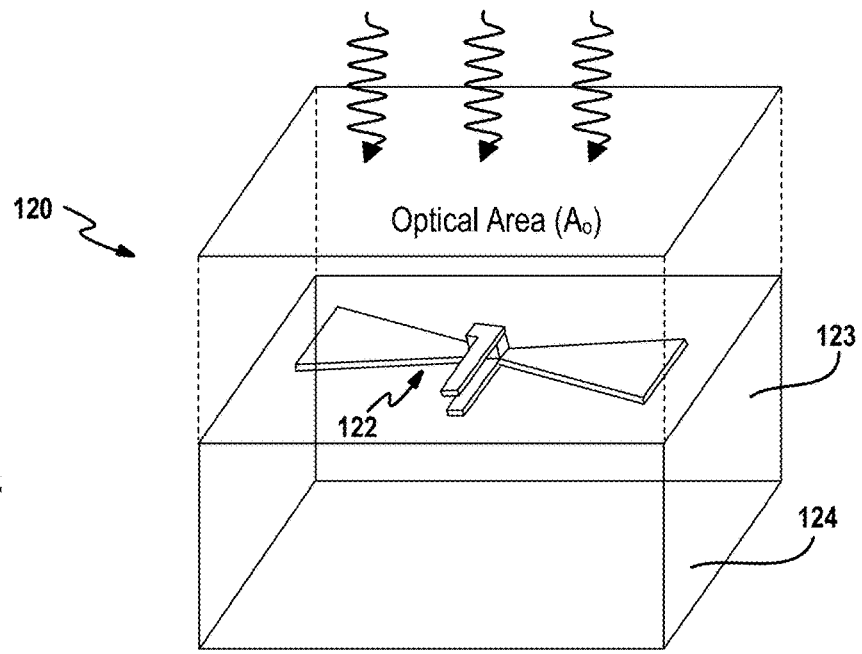

In one aspect of this disclosure, the energy conversion device can be integrated into an infrared (IR) detector. FIG. 12A illustrates a simple schematic of a traditional p-n junction IR-detector with a relatively large surface area ~40 μm×40 μm; whereas, FIG. 12B illustrates an IR detector 120 with the proposed energy conversion device 122 integrated therein. In this example embodiment, the energy conversion device 122 is disposed on a top surface of a substrate 123 and a metal plate 124 is formed on an opposing bottom surface of the substrate. In other embodiments, it is understood that a plurality of energy conversion devices may be disposed on the surface of the substrate. Other arrangements for the IR detector 120 also fall within the scope of this disclosure.

For comparison, the optical area ($A_o$) of the traditional IR detector, defined as the physical area where the bulk photodetector is exposed to near IR radiation, is chosen to be slightly larger than the antenna effective aperture. Note that the simulation uses the periodic boundary conditions and thus the results are valid for much larger surface area. The active area of the semiconductor ($A_d$) for the photodetector 120 with the integrated bowtie nanoantenna is merely 30 nm×30 nm. The impedance matched resonant bowtie antenna generates a field enhancement of the order of approximately 23.5 in the InGaAsSb block, which in turn increases the gain of photon generation. At the same time, the smaller active area of the photodetector generates less noise current, and therefore it is expected that the detectivity of the proposed photodetector 122 will be significantly improved. Other advantages include design of detector arrays on flexible membranes, high resolution focal plane array design (close to diffraction limit), polarimetric sensing, ease of signal pickup, and ease of grouping elements in a series or parallel configuration.

Next, the signal-to-noise advantage is examined due to the field enhancement and the size reduction of the active area of the InGaAsSb diode attached to the bowtie antenna. In the example considered here, the ratio of $A_o/A_d$ is almost 644 where $A_o$ is the effective area of the antenna modeled by a rectangle with dimensions 950 nm×610 nm and $A_d$ is 30 nm×30 nm. The noise current of traditional photodetectors depends on the dark current $i_D = i_{sat}(e^{qV/kT} - 1)$ and the photo-generated current $i_p = q\eta(\Phi_{sig} + \Phi_b)A_d$. Here $i_{sat}$ is the reverse saturation current which scales with the area of the detector $A_d$, q is the charge of an electron, K is Boltzmann constant, and T is the temperature in Kelvin. Also η is the quantum efficiency (including the reflectance of the detector) in the photon flux density photons/(cm$^2$·s) incident on the photodetector and $\Phi_{sig}$ and $\Phi_b$ are, respectively, the photon flux density from the signal and the background sources. By using the dark resistance of the diode at zero bias voltage, given by $$R = \left(\frac{\partial i_D}{\partial V}\right)^{-1}_{V=0} = \frac{kT}{qi_{sat}}, \tag{1}$$

the reverse saturation current is found to be $i_{sat}$=kT/qR. The noise current generated in the photodetector can be computed as follows:

$$i_N = \sqrt{2q(i_D + 2i_{sat} + i_p)\Delta f}, \tag{2}$$

where $i_D$, $i_{sat}$ and $i_p$ represent, respectively, the contribution of the shot noise, the Johnson noise, and the photon noise. Using expressions for the dark current, the reverse saturation current, and the photo-generated current, the noise current is explicitly represented by $$i_N = \sqrt{2q\left[\frac{kT}{qR}e^{\frac{qV}{kT}} + \frac{kT}{qR} + q\eta(\Phi_{sig} + \Phi_b)A_d\right]\Delta f}, \tag{3}$$

where Δf is the detector bandwidth. When Johnson noise is dominant, the detector is considered as Johnson noise-limited detector and when the photon noise is dominant, the detector is considered as the photon noise-limited detector. Thus, for conditions where $\Phi_{sig} \ll \Phi_b$ and under zero bias voltage (V=0), it follows $$i_N = \sqrt{\left[4\frac{kT}{R} + 2q^2\eta\Phi_b A_d\right]\Delta f}. \tag{4}$$

The first term is the well-known Johnson noise current. Note that this includes the shot noise corresponding to zero bias voltage. The sensitivity of traditional photodetectors for this Johnson noise-limited case will be detailed.

When Johnson noise is the dominant factor in detector's noise current, the SNR ratio can be obtained from $$\frac{i_{sig}}{i_N} = \frac{q\eta\Phi_{sig}A_d}{\sqrt{4\frac{kT}{R}\Delta f}}. \tag{5}$$

The kT/R term is proportional to the reverse saturation current which scales with the detector area (since R is inversely proportional to $A_d$). Thus the SNR scales with the square root of the detector area which is equal to the physical area for the traditional detectors. NEP is defined as the signal power (hc/λ·$\Phi_{sig}$·$A_d$) equal to the noise power corresponding to SNR of 1 and is given by $$NEP = \frac{1}{q\eta}\sqrt{4\frac{kT\Delta f}{R}\left(\frac{hc}{\lambda}\right)}. \quad (6)$$

Hence NEP scales with the square root of the detector area since R is inversely proportional to $A_d$ which is equal to $A_o$. A figure of merit D* is often used to compare different photodetectors. This quantity is defined in such a way to normalize the sensitivity (1/NEP) to a 1 cm² area and 1 Hz detector bandwidth with a unit of cm Hz$^{1/2}$ W$^{-1}$. Hence, the detectivity for the Johnson noise limited case can be computed from $$D^* = \frac{\sqrt{A_o \Delta f}}{NEP} = q\eta \sqrt{\frac{A_o R}{4kT}\left(\frac{\lambda}{hc}\right)}. \quad (7)$$

Since the detectivity is area independent, the sensitivity of the conventional photodetectors cannot be enhanced by changing the detector area.

Considering the field enhancement at the terminals of the antenna and noting that photon flux density is proportional to the square of the field intensity, the photon flux density on the small photodetector is $\Phi_{sig}' = \Phi_{sig} \cdot g^2$, where g is the antenna field enhancement factor. This equation assumes all photons captured by the effective area of the antenna are delivered to the antenna terminals. Of course, even under impedance matching condition, a percentage of the photons are scattered similar to the reflection of the photons from the bulk material. Placing a metal reflector 124 behind the nanoantenna 122 at a distance equal to the odd integer multiple of λ/4 reflects the forward scattered field and the array will absorb that component as well. The calculation shows that the matched antenna array can absorb 95% if the incident energy, of which 25% is lost in metallic traces. Hence, the overall power absorption is slightly higher than 70%. The absorption rate of thick layer of InGaAsSb at normal incidence is close to 60%. Thus assume the scattered photons are accounted for in the quantum efficiency and that the quantum efficiency for both cases are approximately the same. As a result, the SNR of the detectors within the bowtie antenna can be evaluated from $$\frac{i_{sig}}{i_N} = \frac{q\eta \Phi_{sig} g^2 A_d}{\sqrt{4\frac{kT}{R'}\Delta f}}, \quad (8)$$

where R' is the dark resistance of the diode at the antenna terminals, which is inversely proportional to $A_d$. In this case, it is noted that the incident energy is captured by the effective area of the array ($A_o$) and the calculation of NEP and D* is shown as $$NEP' = \frac{1}{q\eta g^2}\sqrt{4\frac{kT\Delta f}{R'}\frac{hc}{\lambda}\frac{A_0}{A_d}}, \quad (9)$$

$$D^* = \frac{\sqrt{A_0 \Delta f}}{NEP'} = q\eta g^2 \sqrt{\frac{A_o R'}{4kT}\frac{\lambda}{hc}\left(\frac{A_d}{A_o}\right)}. \quad (10)$$

Comparing Eqs. (10) and (7) and noting that R'/R=$A_o/A_d$, it becomes clear that the detectivity of photodiode embedded in the nanoantenna is improved by $g^2\sqrt{A_d/A_o}$. For the example considered here g=23 and $\sqrt{A_d/A_o}$=1/25.38, the detectivity can be improved by a factor of 20.85. It is understood that dimensions for the IR detector are provided to illustration purposes and not considered limiting.

As noted above, the proposed energy conversion device 10 can also serve as the basis for a photovoltaic device which generates a desired DC current or voltage. In some embodiments, the photovoltaic device is comprised of an array of nanoantennas fabricated on a substrate. The value of the DC current and/or voltage can be controlled by properly making series and/or parallel connections between the nanoantennas. The length of the connecting traces should be in such a way as not to perturb the IR performance of the adjacent nanoantennas.

In one embodiment, a narrow metallic trace (i.e., metal interconnect) is used to connect the two ends of adjacent bowtie antennas in the middle of the base of the metallic triangle, where the current distribution is null at the resonance. That is, the metal interconnects electrically couple in middle of a longitudinal end of the bowtie antennas as seen in FIG. 13. The optimization of the length of the connecting traces is guided by inspecting the standing wave pattern along the trace. Choosing a proper length creates a current standing wave pattern with minima at the end of all bowtie antennas in the array. It should be noted that the field enhancement value at the terminals of an antenna component in this array is the same value (~23.5) as that of an isolated antenna.

For example, the optimized length of the gold trace between the antennas in series is found to be around 360 nm in FIG. 13A. This length supports a current standing wave distribution over the antennas that are identical to the current distribution of an isolated antenna. In FIG. 13B, the length of the connecting trace for parallel configuration is set to be 720 nm at each vertical and horizontal sides. Depending on the application, the lengths of these traces can vary but are chosen to support a standing wave to maintain a null current at the end of the bowties. Segment length is also chosen to set a null current at the bends to minimize their radiation, and set the desired horizontal separation between the adjacent series elements. The number of nanoantennas connected in series and parallel can be chosen in order to satisfy the required DC voltage and current from the TPV panel.

Figure 14:
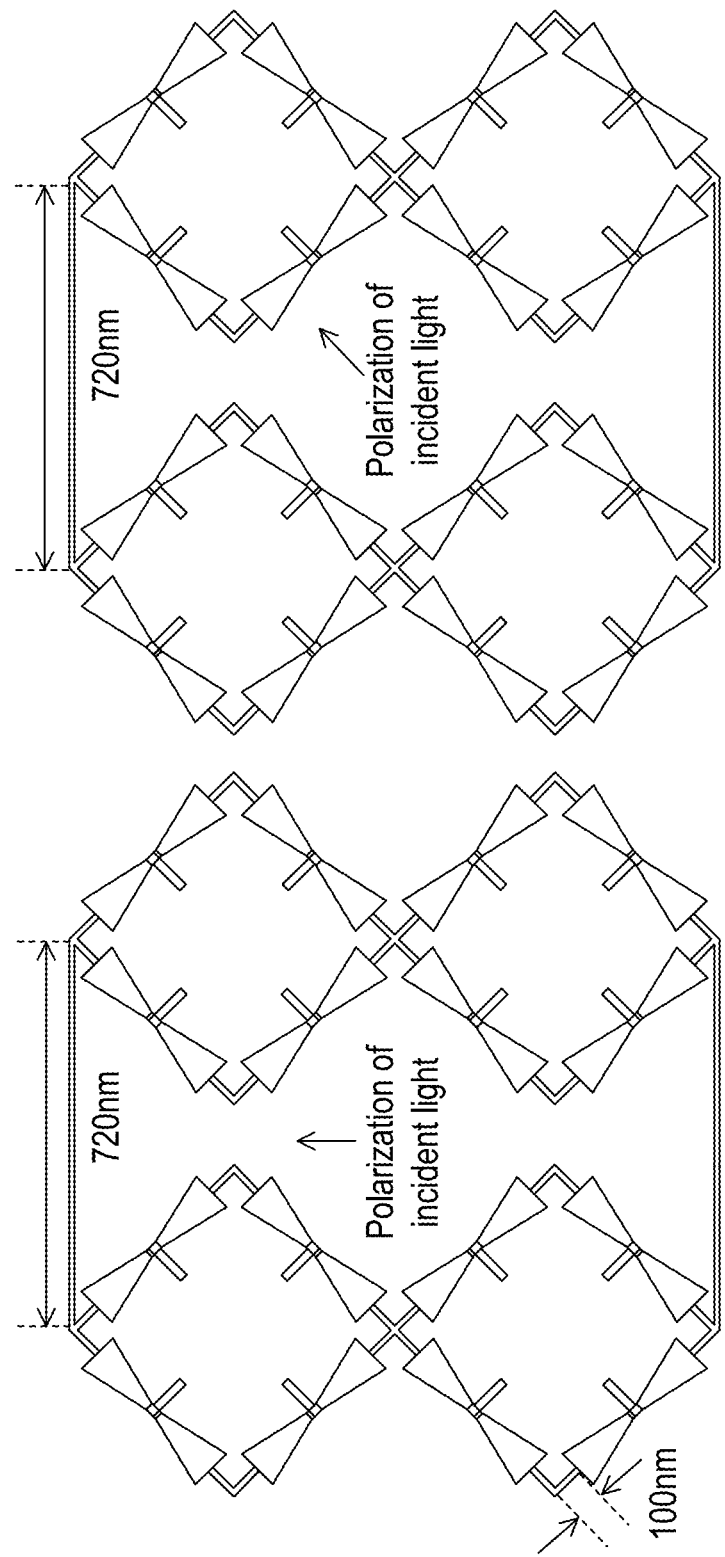
FIG. 14 is a diagram depicting another example bowtie array configuration.

Another configuration, where the TPV cells can be connected is in 45°-tilted configuration as shown in FIG. 14. The connecting trace between each bowtie antenna is set to 100 nm, which preserves the required current distribution on the antennas in each square ring. Also the length of the horizontal trace, which connects two adjacent 45°-tilted bowtie antenna square rings is set to 720 nm, which is consistent with the connecting trace length of the linear arrays shown in FIG. 13. Also an antenna component in this array configuration maintains the same field enhancement as that of an isolated antenna. This pattern is specifically designed to collect all the power of an unpolarized incident IR radiation. As expected, the vertical polarization equally excites all elements of the ring, whereas the 45°-polarized wave strongly excites the parallel elements only. It is worth mentioning here that the proposed nanoantenna loaded with InGaAsSb can be utilized as sensitive IR detector and the polarization sensitive feature of the design allows for polarimetric measurements of IR radiation.

A bowtie nanoantenna loaded with a nanometer-size (30 nm×30 nm×30 nm) low bandgap InGaAsSb block is proposed as an efficient and flexible TPV cell. The frequency dependent high impedance of the semiconductor load at IR frequencies is matched to the input impedance of the bowtie nanoantenna. To achieve the input impedance matching at the desired frequency, the bowtie nanoantenna is designed to operate at its anti-resonance mode, where a high input resistance can be achieved. The nanometer-size load dimensions are adjusted to match the input resistance and the high capacitance of the load can be compensated by a shunt open nano-transmission line stub. The dimensions of the antenna, the load, and the inductive open stub are optimized for maximum power transfer at the desired band near 180 THz, where the quantum efficiency of the semiconductor is the maximum.

At the desired band, the optimized nanoantenna loaded with an InGaAsSb block shows a field enhancement on the order of ~23.5 (27.4 dB) at its terminals. Also, the absorption rate of an infinite array of the optimized bowtie nanoantennas, backed by a metallic reflector located at a quarter-wave behind the array, is ~95% which is 50% higher than the absorption rate of a thick layer of the bulk InGaAsSb. In addition, the design of series and parallel array configurations for achieving the desired DC voltage and current output is considered. Nanoantenna elements are connected by resonant segments of metallic traces at the base of the adjacent bowtie antennas to form different connection configurations without adversely affecting the IR performance of the antenna elements. In practice, a dense array (~$10^6$ antenna elements) of tiny bowtie antenna loaded with InGaAsSb TPV cell can be integrated into an mm-sized TPV system. Also a thin flexible/conformal implementation of such an IR photovoltaic conversion unit can be used for power scavenging from heat sources; for example, from electronic circuits or spacecraft thrusters for deep space missions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An energy conversion device, comprising:
    a conversion cell comprised of a body defining one or more surfaces for receiving infrared radiation, wherein the conversion cell includes at least two semiconductors forming a p-n junction cell and is comprised of materials having a bandgap energy level 130 Terahertz or lower; and
    a nanoantenna configured to receive infrared radiation at a desired frequency and, in response to the infrared radiation at the desired frequency, with antenna elements configured to operates at a parallel resonance, wherein the nanoantenna has physical dimensions less than a thousand nanometers and is in shape of a bowtie with two terminals, such that the conversion cell is arranged at middle of the nanoantenna and between the two terminals of the nanoantenna and a fan angle of the bowtie is set to a value so that input impedance of the nanoantenna matches the load resistance at the desired frequency.

2. The energy conversion device of claim 1 wherein the conversion cell is comprised of indium gallium arsenide antimonide.

3. The energy conversion device of claim 1 wherein the conversion cell is further defined as a cube having a thickness sized to match the radiation resistance of the nanoantenna.

4. The energy conversion device of claim 1 wherein the bowtie having a length set at a value so that the parallel resonance of the nanoantenna occurs at the desired frequency.

5. The energy conversion device of claim 1 further comprises a shunt inductor electrically coupled to terminals of the nanoantenna to compensate for the capacitive susceptance of the conversion cell in middle of the nanoantenna.

6. The energy conversion device of claim 5 wherein the shunt inductor is comprised of an open-ended transmission line extending outwardly from each terminal of the nanoantenna, where the transmission lines are oriented transverse to length of the nanoantenna and parallel to each other.

7. The energy conversion device of claim 1 wherein the conversion cell is impedance matched to the nanoantenna for maximum power transfer.

8. The energy conversion device of claim 1 is disposed on a top surface of a substrate, wherein a metal plate is formed on a bottom surface of the substrate and distance between the top surface and the bottom surface is an odd integer multiple of quarter wavelength for enhanced efficiency and sensitivity.

9. The energy conversion device of claim 8 wherein the conversion cell operates in a photoconductive mode as an uncooled sensitive photodetector with improved detectivity.

10. An energy conversion device, comprising:
    a substrate; and
    an array of nanoantennas fabricated on the substrate, each nanoantenna in the array of nanoantennas is spatially separated from each other and with antenna elements is configured to operates at a parallel resonance to receive infrared radiation at a desired frequency, each nanoantenna in the array of nanoantennas is in the shape of a bowtie with physical dimensions less than a thousand nanometers, wherein adjacent nanoantennas are electrically coupled together by a thin metal interconnect deposited on the substrate.

11. The energy conversion device of claim 10 wherein the metal interconnect electrically couples to a given nanoantenna at a location where current distribution for the given nanoantenna is null at parallel resonance.

12. The energy conversion device of claim 10 wherein the nanoantenna defines a longitudinal axis extending along length of the bowtie between two distal ends and the metal interconnect electrically couples in the middle of a distal end of a given nanoantenna.

13. The energy conversion device of claim 10 wherein a subset of bowtie nanoantennas in the array of nanoantennas are connected in series with each other by metal interconnects and length of the metal interconnects is selected so as not to change the infrared performance of the array or nanoantennas.

14. The energy conversion device of claim 10 wherein a subset of bowtie nanoantennas in the array of nanoantennas are connected in parallel with each other by metal interconnects and length of the metal interconnects is selected so as not to change the infrared performance of the array or nanoantennas.

15. The energy conversion device of claim 10 wherein each nanoantenna encapsulates a portion of a conversion cell and transfers received infrared radiation thereto; and the conversion cell includes at least two semiconductors forming a p-n junction.

16. The energy conversion device of claim 15 wherein each nanoantenna has two terminals, such that the conversion cell is arranged at middle of the nanoantenna and between the two terminals of the nanoantenna.

17. The energy conversion device of claim 15 wherein the conversion cell is comprised of materials having a bandgap energy level 130 Terahertz or lower.

* * * * *